(12) United States Patent
Higashikawa et al.

(10) Patent No.: US 6,333,138 B1
(45) Date of Patent: Dec. 25, 2001

(54) EXPOSURE METHOD UTILIZING PARTIAL EXPOSURE STITCH AREA

(75) Inventors: Iwao Higashikawa, Tokyo; Takayuki Abe, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/520,631

(22) Filed: Mar. 7, 2000

(30) Foreign Application Priority Data

Mar. 8, 1999 (JP) .................................................. 11-060080

(51) Int. Cl.⁷ .................................................... G03C 5/00
(52) U.S. Cl. .......................................... 430/296; 430/942
(58) Field of Search ..................................... 430/296, 942

(56) References Cited

U.S. PATENT DOCUMENTS 6,258,511 * 7/2001 Okino ................................... 430/296

FOREIGN PATENT DOCUMENTS 3-246925  11/1991 (JP) .

OTHER PUBLICATIONS

Markle, "The Future and Potential of Optical Scanning Systems," Solid State Technology, pp. 159–166, Sep. 1984.
Bohlen et al., "High Throughput Submicron Lithography with Electron Beam Proximity Printing," Solid State Technology, pp. 210–217, Sep. 1984.

* cited by examiner

*Primary Examiner*—Christopher G. Young
(74) *Attorney, Agent, or Firm*—Finnegan, Henderson, Farabow, Garrett, & Dunner, L.L.P.

(57) ABSTRACT

An exposure method of sequential beam, contributing to the improvement of alignment accuracy at connecting portion at the end part of an exposure region, as well as pattern dimension accuracy is provided. The method comprises the steps of dividing an area to be exposed into a plurality of fields each being determined by the deflection width of the main deflector, dividing each field into a plurality of sub-fields each being determined by the deflection width of the sub-deflector, applying a sequential exposure process to each field by using a variable shaped electron beam, and applying a multiple exposure process to an area where adjacent fields overlap each other, wherein the multiple exposure process is conducted in the area in units of sub-field, the exposure dose at each of exposure unit is determined such that the total exposure dosage in the area subject to the multiple exposure process is set equal to an exposure dosage used when single exposure process is applied, the exposure dosage in the area subject to multiple exposure process is decreased in steps, in the direction perpendicular to the longitudinal direction of the boundary portion from the outer edge of the field towards the outside of the field, an exposure dosage in the area subject to the multiple exposure process is determined using the minimum exposure dosage available in the exposure apparatus as the lower limit.

8 Claims, 14 Drawing Sheets

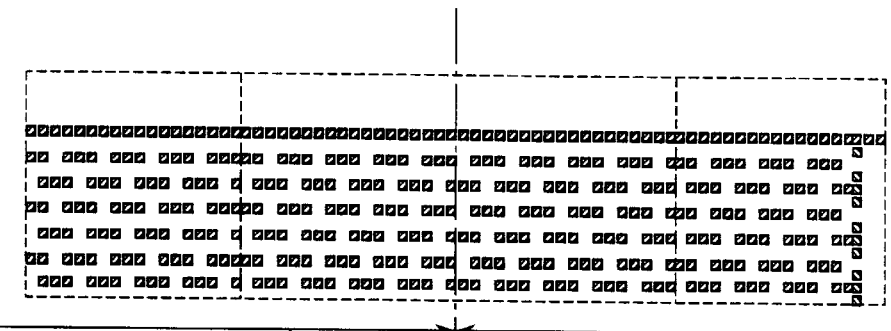
FIG. 3A
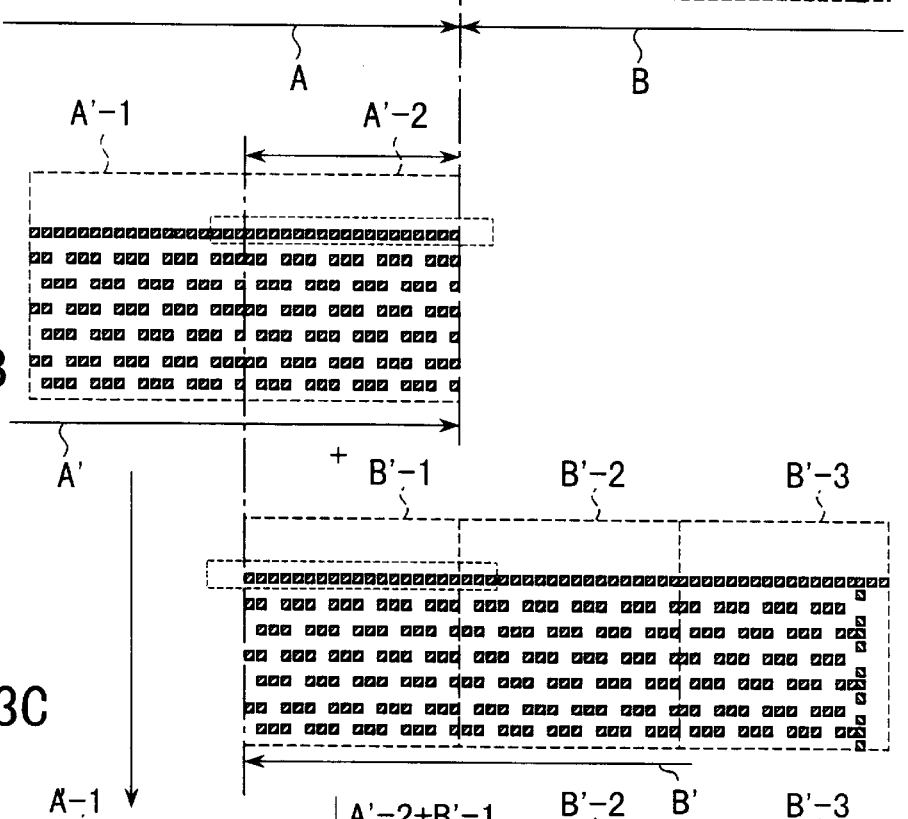
FIG. 3B
FIG. 3C
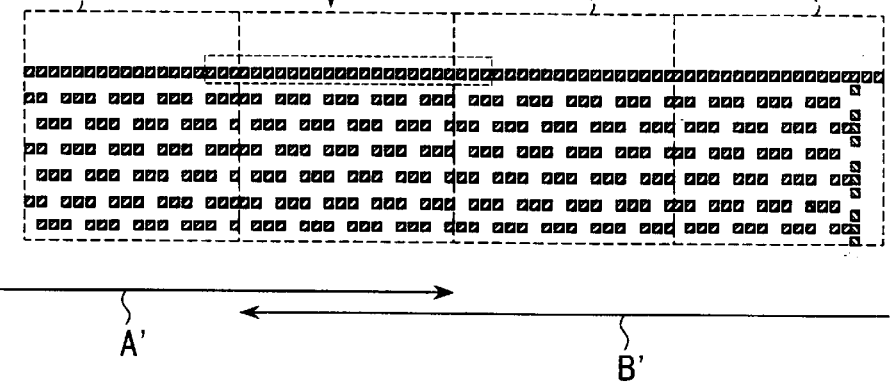
FIG. 3D

+

EXPOSURE METHOD UTILIZING PARTIAL EXPOSURE STITCH AREA

CROSS-REFERENCE TO RELATED APPLICATION

This application is based upon and claims the benefit of priority from the prior Japanese Patent Application No. 11-060080, filed Mar. 8, 1999, the entire contents of which are incorporated herein by reference.

BACKGROUND OF THE INVENTION

The present invention relates to a technique to image an LSI pattern onto an energy-sensitive material on a substrate and more specifically to an exposure system and method in which an exposure area is divided into subareas and the subareas are exposed in a step and repeat fashion using shaped beams.

With conventional various exposure techniques, an area to be exposed is generally larger than a unitary area that can be covered by exposure systems. For this reason, each area to be exposed is divided into subareas and each of the subareas is exposed in sequence. In the case that an area corresponding to a transferred pattern is constituted by a plurality of divided areas, it is very important how well the boundary portions of adjacent exposure areas are to be connected.

It has been known that in a system in which an exposure area is exposed by using light and combining unitary exposure areas, mask patterns are transferred so that adjacent exposure areas overlap each other in their boundary portions. According to this method, a problem of pattern failure is eliminated in which exposure dosage and position change in step-like manner in the overlapping zone of the exposure areas. To be specific, when two exposure areas are arranged to overlap each other in their boundary portions, the exposure dosages are adjusted so that the exposure in the overlapping zone of one exposure area is decreased progressively toward the end of that area and, in the other exposure area, the exposure is decreased in the opposite direction. As a result, at the termination of exposure, the sum of exposure dosages at any point in the overlapping zone of two exposure areas becomes constant. It therefore becomes possible to prevent pattern size and position from changing in step-like manner in the overlapping zone.

However, such a method as described above has not been able to be used with a step and repeat exposure system that controls exposing energy based on beam blanking time management.

In the step and repeat exposure system, each of shots, the minimum unit of exposure, is exposed in a different size but with a predetermined exposure dosage, by a predetermined or shaped beam. The system suffers from a limitation on the minimum beam irradiation time. The exposure dosages are treated as digital data (as opposed to analog data) and hence set in steps.

Having such features, the step and repeat (including step and scan) exposure system has no ability to, in exposing the overlapping zone, change progressively the exposure dosages from a constant value to zero as in photolithography. In electron-beam step and repeat lithography, therefore, the use of the overlap exposure as utilized in photolithographic techniques has been limited to the following ways.

One of conventionally proposed methods is to, in exposing each of overlapping adjacent exposure areas, expose shots of a pattern that resides across the boundary between the areas with half of exposing energy for the non-overlapping portions of the exposure areas, thereby improving the exposure accuracy in the boundary portion of the exposure areas. With this method, additional data processing is required to select patterns that reside across the boundary, making the overall data processing complex. In addition, there is a limit on the effectiveness of improvement in accuracy.

Another approach has been adopted which reduces and makes uniform the effects of the boundary portion by changing the boundary position and making multiple exposure. With this method, the degree to which exposure dosages change in steps in the boundary portion is reduced. However, as the multiplicity of exposure increases, the time required for exposure processing increases. In addition, the effect of step-like changes in exposure dosage still remains. Thus, a sufficient reduction of pattern failures cannot be effected.

Thus, there have been various proposals in the field of step and repeat lithography for improving the accuracy of connection between patterns in the boundary portion of exposure areas. However, these methods cannot be applied to the step and repeat lithography without modifications or cannot achieve sufficient effectiveness in the step and repeat lithography.

BRIEF SUMMARY OF THE INVENTION

It is therefore an object of the present invention to provide a step and repeat exposure system and method which permits the accuracy of connection between exposure areas to be improved and makes a contribution to the improvement of pattern accuracy.

According to an aspect of the present invention, there is provided an exposure method for making a desired pattern onto the surface of a sample by dividing an exposure area into a plurality of subareas, subjecting the subareas to exposure in a step and repeat fashion and subjecting the boundary portion between adjacent fields to multiple exposure, characterized by setting the total exposure dosage (at any exposure position) in the boundary portion subjected to multiple exposure equal to an exposure dosage (at any exposure position) in the other portions of the exposure areas, and setting the percentage exposure dosage in the boundary portion of each of the adjacent exposure areas to change in steps, decreasing from a predetermined value to the minimal value for available exposure dosage in the apparatus.

The exposure method of the present invention is preferably practiced by:

(1) Producing a variable- or non-variable-shaped beam based on exposure data including pattern information, pattern placement information and exposure dosage information, directing the shaped beam to a predetermined position for a time corresponding to a predetermined exposure dosage to make a beam shot as a unit, and repeating the beam shot sequentially.

(2) Using at least two-stage deflection type of exposure equipment in which a main deflection area covered by a main deflector is separated into sub-deflection areas covered by a at least one-stage sub-deflector, a sub-deflection area is specified by the main deflector, and a beam is directed to a predetermined position in the specified sub-deflection area by the sub-deflector, and determining an area subjected to the multiple exposure in sub-deflection area units. Alternatively, an apparatus of one-stage deflection type may be used, where an area subjected to multiple exposure process is defined by a given deflection width of the apparatus.

(3) Setting each exposure dosage in the multiple-exposure area on the basis of a minimum exposure dosage available in exposure equipment.

(4) As a beam for exposure, using an optical beam, or a charged beam such as an electron beam or ion beam, and the exposure dose of each beam shot given by the beam is controlled a blanking element.

(5) Allowing the exposure data to contain information for correcting the proximity effect associated with electron-beam lithography, the information including at least exposure dosage correction data, and using different exposure dosage data in part of patterns.

According to the first aspect of the invention, there is provided an exposure method for forming a desired pattern on the surface of an object by exposing the surface with an exposure apparatus, comprising the steps of: dividing an area to be exposed into a plurality of fields; applying a sequential exposure process to each of the plurality of fields by using a shaped beam, wherein: an area where adjacent fields overlap each other is subject to multiple exposure process, the exposure dosage given by the shaped beam is controlled in a manner such that the total exposure dosage at any exposure unit in the boundary portion for multiple exposure is set equal to an exposure dosage used when single exposure process is applied. And the exposure dosage in the boundary portion of each of the adjacent fields is increased in steps, within the range between a least exposure dose and an exposure dose less than a predetermined exposure dose by the least exposure dose (i.e., an exposure dose obtained by subtracting the least exposure dose from a predetermined exposure dose), in the direction perpendicular to the longitudinal direction of the boundary portion from the outer edge of the field towards inside of the field, exposure dosage in the area subject to multiple exposure process is determined on the basis of a minimum exposure dose available in the exposure apparatus.

In the above method, the least exposure dose in the area subject to the multiple exposure process may be substantially equal to the minimum exposure dose available in the exposure apparatus. Further, in the case that the area subject to the multiple exposure process is processed by at least a first exposure and a second exposure, the exposure dose of the second exposure may be determined by subtracting the exposure dose of the first exposure from a desired exposure dose.

Furthermore, in the above method, a variable shaped beam and/or a non-variable shaped beam may be generated on the basis of exposure data, a beam shot as a unit may be provided by projecting the shaped beam at a desired position during a time period corresponding to a desired exposure dose, on the basis of the exposure data, and the beam shot is repeated sequentially to write a desired pattern.

In addition, the exposure apparatus may comprise a main deflector and at least one-stage sub-deflector, where a main deflection area covered by the main deflector comprises plural sub-deflection areas each covered by the at least one-stage sub-deflector, the plural sub-deflection areas are positioned by the main deflector, and the shaped beam is oriented to project on the surface of the object at a desired position in one of the plural sub-deflection areas, the area subject to multiple exposure process is determined in units of the sub-deflection area.

According to the second aspect of the invention, there is provided A method for forming a desired pattern on the surface of an object by exposing the surface of the object with an exposure apparatus having a main deflector and at least one-stage sub-deflector, comprising the steps of: dividing an area to be exposed into a plurality of fields each being determined by the deflection width of the main deflector; dividing each field into a plurality of sub-fields each being determined by the deflection width of the sub-deflector; applying a sequential exposure process to each field by using a variable shaped electron beam, and applying a multiple exposure process to an area where adjacent fields overlap each other, wherein: the multiple exposure process is conducted in the area in units of sub-field, the exposure dose at each of exposure unit is determined such that the total exposure dosage in the area subject to the multiple exposure process is set equal to an exposure dosage used when single exposure process is applied, the exposure dosage in the area subject to multiple exposure process is increased in steps, within the range between a least exposure dose and an exposure dose less than a predetermined exposure dose by the least exposure dose, in the direction perpendicular to the longitudinal direction of the boundary portion from the outer edge of the field towards the inside of the field, an exposure dosage in the area subject to the multiple exposure process is determined on the basis of the minimum exposure dosage available in the exposure apparatus.

In the above method, the least exposure dosage in the area subject to the multiple exposure process may be substantially equal to the minimum exposure dosage available in the exposure apparatus. Further, in the case that the area subject to the multiple exposure process is exposed by at least two exposures, the exposure dose of a selected one of the at least two exposures may be determined by subtracting the sum of the exposure doses of the at least two exposures excluding the selected one from a desired total exposure dose.

According to the third aspect of the invention, there is provided an electron beam exposure apparatus for forming a desired pattern on the surface of an object by exposing the object, comprising: an electron beam generator generating an electron beam; a blanking control circuit controlling exposure dose by blanking the electron beam; a main deflector deflecting the electron beam; at least one sub-deflector deflecting the electron beam deflected by the main deflector; a beam deflection control circuit controlling the main deflector and the sub-deflector; a control computer unit controlling the blanking control unit and beam deflection control circuit, the control computer unit controlling the exposure dose through the blanking control circuit and controlling the main deflector and the sub-deflector through the beam deflection control circuit, in a manner such that an area to be exposed is divided into a plurality of fields each being determined by the deflection width of the main deflector, that each field is divided into a plurality of sub-fields each being determined by the deflection width of the sub-deflector, that a sequential exposure process is applied to each field by using a variable shaped electron beam, and that a multiple exposure process is applied to an area where adjacent field overlap each other at the end portions, wherein: the control computer unit: conducts the multiple exposure process in the area subject to the multiple exposure process in units of a predetermined number of the sub-fields, determines the exposure dose at each of exposure unit such that the total exposure dosage in the area subject to multiple exposure process is set equal to an exposure dosage used when single exposure process is applied, and increases the exposure dosage in the area subject to multiple exposure process in steps, within the range between a least exposure dose and an exposure dose less than a predetermined exposure dose by the least exposure dose, in the direction perpendicular to the longitudinal direction of the area subject to multiple exposure process from the outer edge of the field towards inside of the field, the exposure dose in the area subject to multiple exposure process is determined on the basis of the minimum exposure dosage available in the exposure apparatus.

In the above apparatus according to the third aspect, the control computer unit may set the least exposure dosage in the area subject to the multiple exposure process substantially equal to the minimum exposure dosage available in the exposure apparatus. Further, in the apparatus, the area subject to the multiple exposure process may be processed by plural exposures, and the control computer unit may determine the exposure dose of the last exposure of the plural exposures by subtracting the sum of the exposure dose of finished exposures from a desired exposure dose.

According to the present invention, a step and repeat exposure system can be provided which allows the prevention of the occurrence of stairlike changes in pattern dimensions and positions in the boundary portion between adjacent exposure areas by, in making multiple exposure in the boundary portion, setting the ratio of exposure dosage in one area to that in the other area so that the multiple exposure area and the non-multiple exposure area are subjected to an equal exposure and changing (increasing or decreasing) the exposure dosages in the boundary portion in steps within in the direction perpendicular to the direction of length of the boundary portion. This leads to an improvement in the accuracy of connection of the adjacent exposure areas and consequently in the pattern-placement accuracy.

Further, by decreasing the exposure dosage for each exposure area from the inside to the outside of the boundary portion, steplike variations are reduced in comparison with the case where the exposure areas are connected with no overlapping zone for multiple exposure. That is, the accuracy of connection between exposure areas can be improved and the pattern-placement accuracy can be improved. Moreover, the multiple exposure zone may be set up in subfield units for multiple exposure. This allows conventional data processing techniques to be used as they are. For this reason, there is no need to introduce intricate exposure data management for improving pattern accuracy. Furthermore, the inventive exposure method can be applied to data subjected to proximity effect correction as used in electron-beam lithography, allowing the accuracy of connection of adjacent exposure areas to be improved with the effect of proximate patterns eliminated. Further, the invention can achieve the best arrangement for the rate of exposure dose for each exposure unit in the multiple exposure zone by setting the rate of exposure rate on the basis of the minimum exposure dose available in the exposure apparatus. Furthermore, the present invention can minimize digitized errors by determining the exposure dose of the second exposure treatment by subtracting the exposure dose of the first exposure treatment from an desired exposure dose determined for the multiple exposure zone which is processed by at lease first and second exposure treatments, regardless of the number of exposure treatments.

The exposure method of the present invention will improve the performance and quality of semiconductor devices.

Additional objects and advantages of the invention will be set forth in the description which follows, and in part will be obvious from the description, or may be learned by practice of the invention. The objects and advantages of the invention may be realized and obtained means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3D are diagrams for use in explanation of exposure processing of the first embodiment, FIG. 3A showing part of two adjacent fields with no overlapping zone, FIG. 3B showing one of the adjacent fields, FIG. 3C showing the other of the adjacent fields, and FIG. 3D showing the manner in which the adjacent fields overlap each other;

FIG. 8A illustrates a set of striped exposure areas provided by the first exposure; and FIG. 8B illustrates another set of striped exposure areas provided by the second exposure; and FIG. 8C shows how the two sets of striped exposure area are overlapped;

DETAILED DESCRIPTION OF THE INVENTION

First Embodiment

Figure 1:
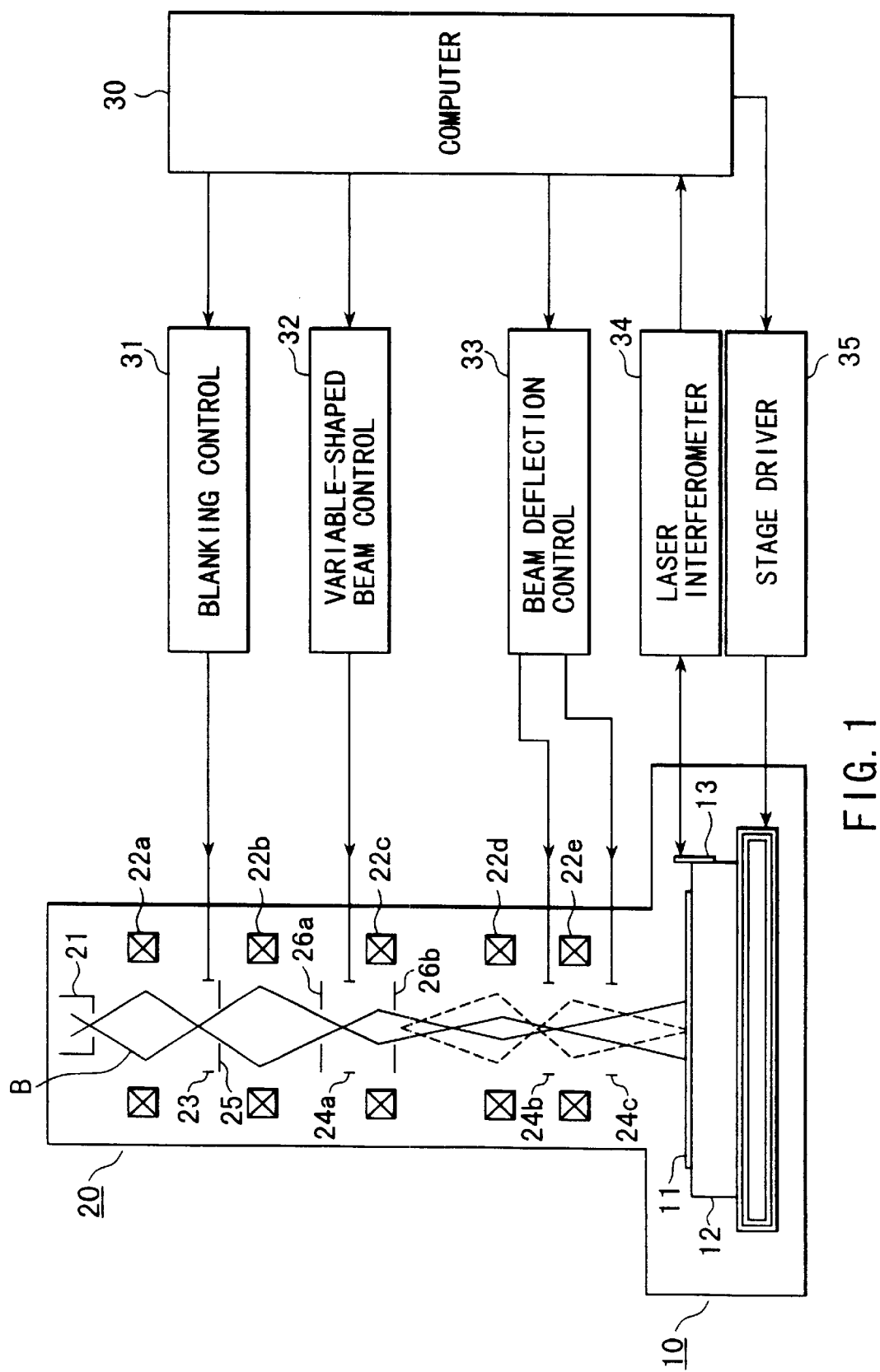
FIG. 1 is a schematic illustration of an electron beam exposure system for use with the present invention.

FIG. 1 is a schematic illustration of a variable-shaped electron-beam exposure system available for a first embodiment of the present invention.

Reference numeral 10 denotes a sample chamber above which an electron optical system 20 is positioned. In the sample chamber 10 is placed a stage 12 on which a substrate to be exposed (sample) is placed. A reflecting mirror 13 is provided on one side of the stage 12. The electron optical system 20 is composed of an electron gun 21, various lenses 22a, 22b, 22c, 22d, and 22e, a blanking electrode 23, deflectors 24a, 24b, and 24c, a blanking aperture 25, and beam-shaping apertures 26a and 26b.

The substrate 11 to be exposed is a substrate which is made of quartz glass (6025 substrate produced by HOYA company) which has a chromium (Cr)-based opaque film coated on its major surface. The substrate is further coated with a film of electron beam-sensitive material. The stage 12 is movable in XY plane and driven by a stage driving system 35. The stage position is monitored by a laser interferometer 34. The height of the substrate 11 can be adjusted by a fine adjustment mechanism (not shown) provided in the stage 11.

In the electron optical system 20, an electron beam B emitted from the electron gun 21 is focused by the lens systems 22a and 22b and then shaped by the shaping apertures 26a and 26b, so that a shaped beam is produced. The shaped beam is imaged onto the substrate by the lens systems 22d and 22e. The position of the beam on the substrate is controlled by the main deflector 24b and the sub-deflector 24c. The beam irradiation time depends on beam blanking by the blanking deflector 23.

In FIG. 1, 31 denotes a blanking controller for applying a blanking voltage to the blanking deflector 23, 32 a variable shaped beam controller 32 for applying a deflection voltage to the shaping deflector 24a, 33 a beam deflection controller for applying deflection voltages to the deflectors 24b and 24c, and 30 a control computer for controlling the controllers 31, 32 and 33, the laser interferometer 34, and the stage driving system 35.

Figure 2A:
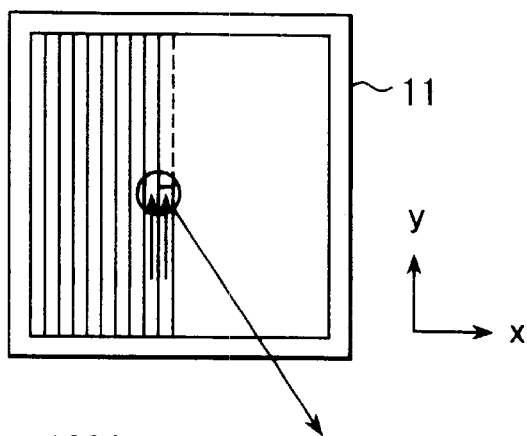
FIGS. 2A, 2B and 2C are diagrams for use in explanation of a basis lithographic procedure according to a first embodiment of the present invention, FIG. 2A showing the manner in which fields are drawn repeatedly in the Y-axis direction by step and scan mode, FIG. 2B showing the manner in which subfields are drawn repeatedly, and FIG. 2C being an enlarged view of four adjacent subfields in FIG. 2B.
Figure 2B:
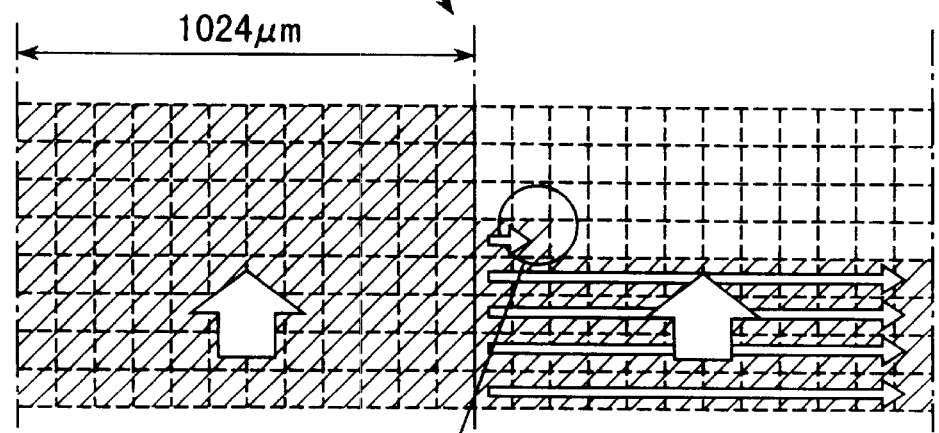
Figure 2C:
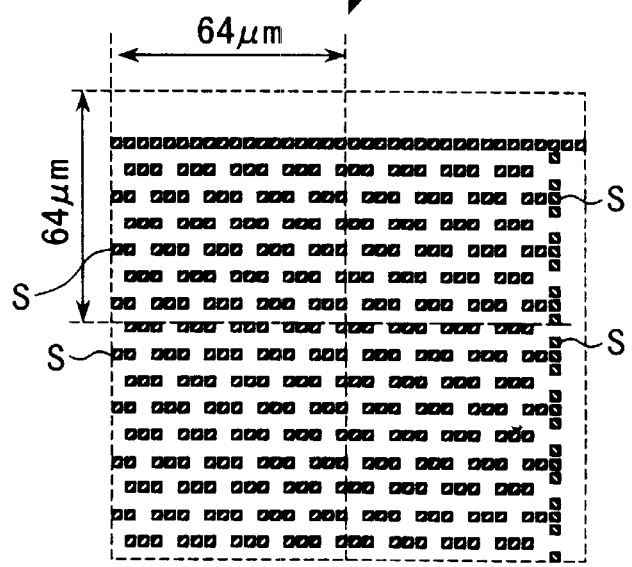

FIGS. 2A, 2B and 2C schematically illustrate a basic lithography procedure used in making a reticle using the system of FIG. 1. As shown in FIGS. 2A and 2B, the substrate 11 is exposed by forming an exposure area (field) having a width of 1024 µm in the X-axis direction and repeating the field in the Y-axis direction. The field 1024 µm in width is formed by, as shown in FIGS. 2B and 2C, repeating the exposure of a small exposure area (subfield), 64 µm on a side, 16 times in the X-axis direction and then making the repeated exposures of the subfield in the Y-axis direction during the stage scanning. The minimum unit of exposure area is a shot S which is exposed by a process of turning on an electron beam and turning off it after a lapse of a predetermined time.

Pattern data to be exposed is divided into pieces of data corresponding to beams producible by the shaping apertures 26. Shot data for producing individual shots are made up of information concerning beam shaping, information concerning beam position, and, if necessary, exposure dose information. The shot data are managed in 64-µm subfield units. The subfield data are collected into an exposure unit (field) in a stripe form for management. These data may be handled as repeating arrangement information.

In exposure processing, a shot is positioned as specified by exposure data using the main deflector 24b and the sub-deflector 24c in synchronism with a position signal from the laser interferometer 34 while the stage 12 on which the to-be-exposed substrate 11 is placed is continuously moved in the Y-axis direction. The stage has also a control function built in, which changes the moving speed of the stage so that the shot is positioned in an area the main deflector 24b can track, thereby allowing the time waiting for processing to be minimized.

Next, an embodiment of the present invention which is directed to reticle making will be described in detail. Prior to reticle making, coefficients of a function for calculating proximity effect correction values are determined by: exposing a pattern of line and space of 1:1 on the entire surface, selecting exposure conditions, baking conditions and development conditions, selecting a reference exposure and a process, making test pattern exposures for calculation of proximity effect correction values while changing the exposure in 5% steps under the processing conditions, and etching the opaque film. The proximity effect correction data processing method is described in, for example, Japanese Journal of Applied Physics, T. Abe, S. Yamasaki, T. Yamaguchi, R. Yoshikawa, and T. Takigawa, Vol. 30, p 2965 (1991).

The substrate 11 is a blanks in which a quartz glass substrate, produced by HOYA company under the name of 6025, has a opaque film of chromium coated on its one side. A positive chemically amplified resist is applied on the opaque film to a thickness of 0.5 µm and then baked on a hot plate for 8 minutes at 90° C. The substrate is next loaded into the sample chamber 10 of the exposure system of FIG. 1 and placed in position on the stage 12. For sufficient substrate temperature control, the substrate was made on stand-by in the sample chamber until the temperature of the substrate reaches a set temperature 23.0° C. of the equipment, thereby preventing a loss of positioning accuracy due to temperature variations.

In exposure processing, exposure dosages are set only to values settable by the exposure system. In the present exposure system, the minimum exposure is set to 0.80 $\mu C/cm^2$ and the exposure can be changed in increments of 0.02 $\mu C/cm^2$. The maximum exposure for a single shot is set to 20 $\mu C/cm^2$. With the exposure data used in this embodiment, the main exposure area is set to an area of 100 mm×132 mm. Various marks are arranged around the main exposure area.

Figure 4A:
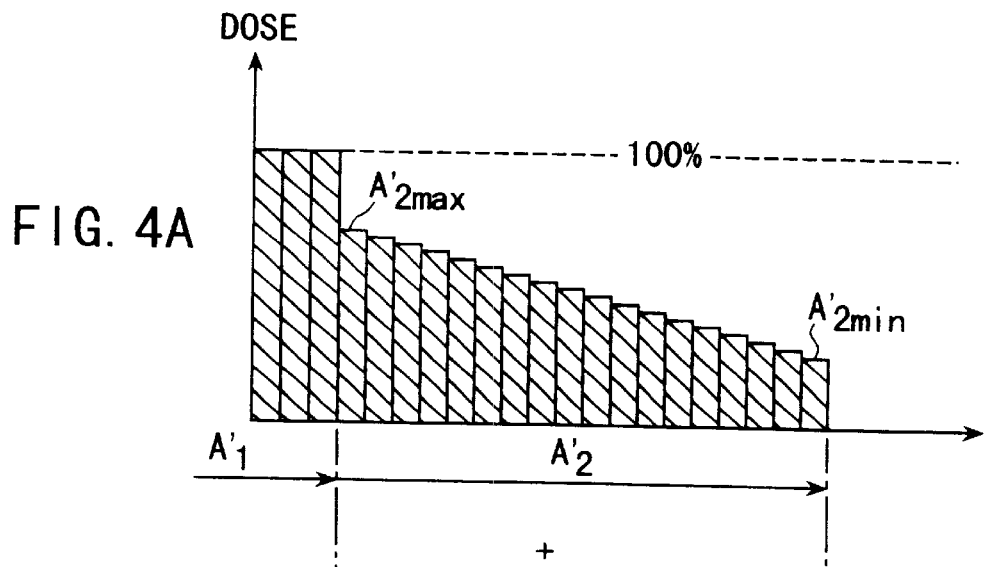
FIGS. 4A to 4C are diagrams for use in explanation of exposure processing of the first embodiment and illustrate the ratio between exposure dosages in the overlapping zone of the adjacent fields, FIG. 4A showing the percentage exposure dosages in the overlapping zone in one field, FIG. 4B showing the percentage exposure dosages in the overlapping zone in the other field, FIG. 4C showing the totalization of the percentage exposure dosages shown in FIGS. 4A and 4B.
Figure 4B:
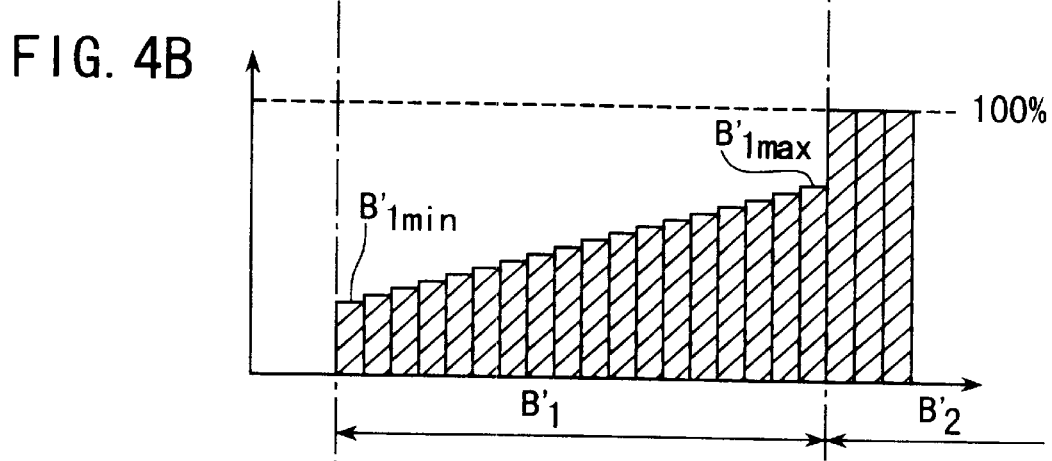
Figure 4C:
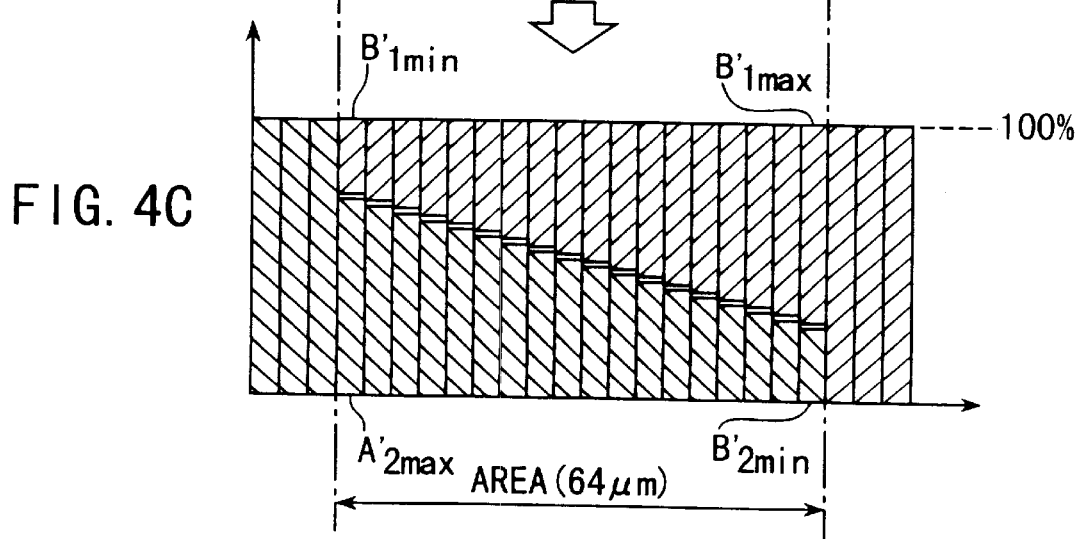
Figure 5:
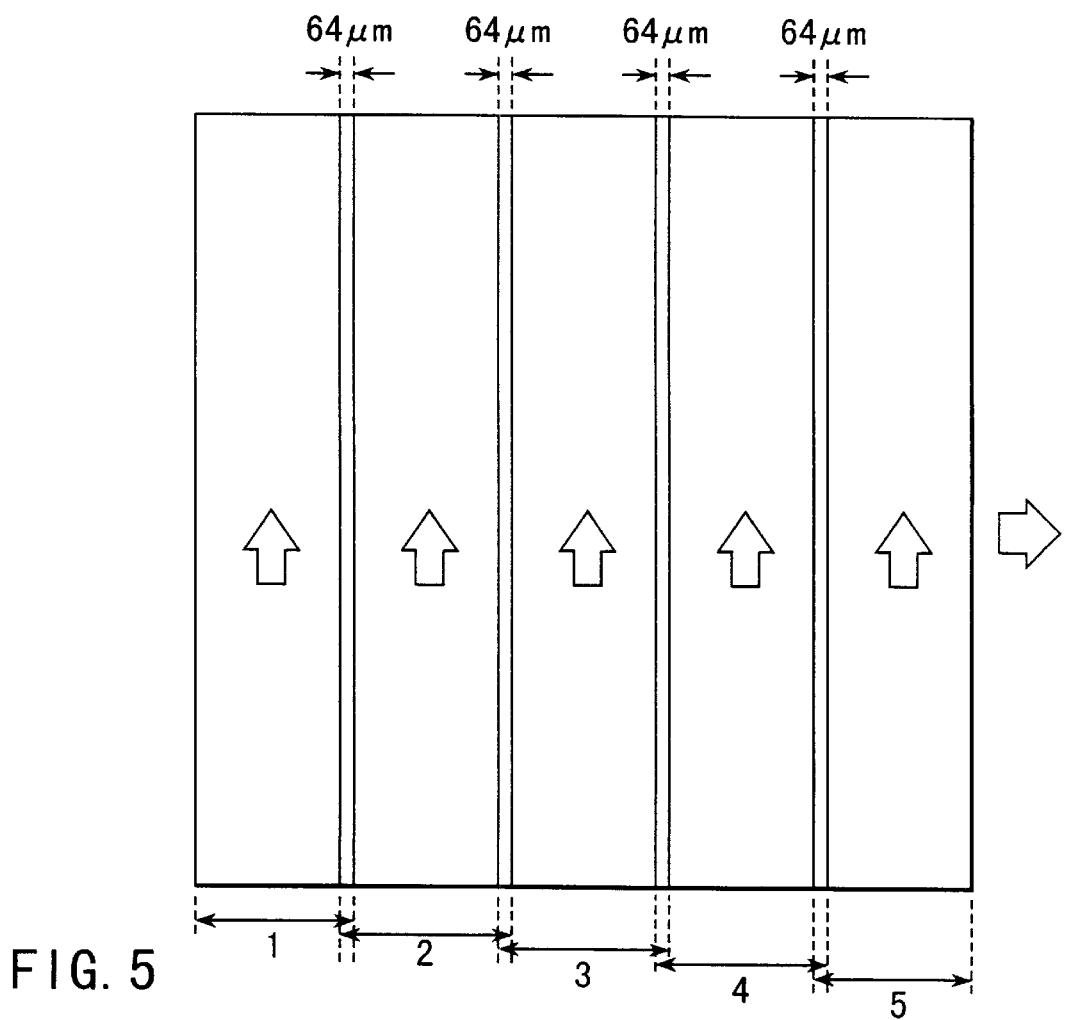
FIG. 5 is a diagram for use in explanation of the exposure processing of the first embodiment and illustrates the manner in which striped exposure areas are exposed in sequence.

The exposure processing is performed such that, as shown in FIGS. 3A to 3D and 4A to 4C, the exposure for overlapping boundary area is set and, as shown in FIG. 5, exposure processing for a striped exposure area (field) is repeated. In each field, 16 small areas (subfields), each of 64 μm on a side, are arranged within the width of 1024 μm. Each striped exposure area overlaps the next striped exposure area by a column of small areas 64 μm in width (overlapping zone) and the overlapping zone is subjected to multiple exposure as shown in FIG. 3.

FIG. 3A shows the conventional boundary area for comparison. In this case, there is no overlap between adjacent exposure areas A and B. FIGS. 3B to 3D illustrate exposure processing in the present embodiment. As shown, adjacent exposure areas A' and B' are arranged to overlap each other by one subfield. More specifically, the rightmost subfield A'2 of the exposure area A' and the leftmost subfield B'1 of the exposure area B' are superimposed.

FIGS. 4A and 4B illustrates the way to distribute exposure dosage in the multiple exposure zone between A' and B'. The horizontal axis represents the position of each shot in the X-axis direction, and the vertical axis represents the ratio of exposure dosage for each shot in the overlapping zone of one exposure area to that for the corresponding shot in the other exposure area. The ratio of exposure dosage is represented by the percentage of exposure dosage for each shot to the exposure dosage calculated by proximity effect correction processing, which is taken to be 100%.

FIG. 4A shows exposure dosage for the stripe A and FIG. 4B shows exposure dosage for the stripe B. FIG. 4C shows the total exposure dosage for the stripes A and B.

In order to avoid the steplike variation of pattern in dimension and position in the boundary region, it is effective to set the minimum value of beam blanking, i.e., the minimum irradiation time identical to the least exposure dose in the multiple exposure zone, which corresponds to the exposure dose $A'_{2min}$ in FIG. 4A, or $B'_{1min}$ in FIG. 4B.

Figure 4D:
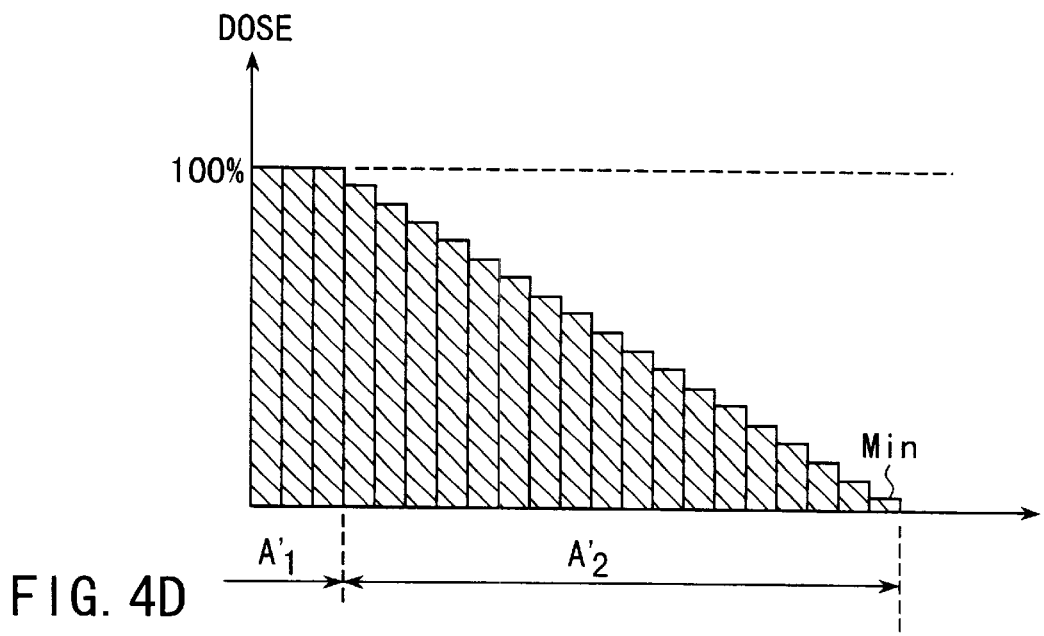
FIG. 4D shows an example for ideal exposure dose arrangement relating to the percentage exposure dosage in FIG. 4A.

When two adjacent exposure regions are arranged so that they overlap each other at their boundary regions, it is preferable to adjust the exposure dose such that the exposure dose is decreased as the exposed area is close to the end portion of respective exposure regions. Ideally, it is most preferable to adjust the exposure dose in the overlapped region in a manner such that the exposure dose is consecutively decreased from 100% to 0%. FIG. 4D shows an example of ideal exposure dose adjustment, in contrast with the adjustment arrangement shown in FIG. 4A. In order to achieve such a exposure dose adjustment for changing the exposure dose from 100% to 0%, it is effective to set the exposure dose M in FIG. 4D as little as possible.

It should be note that there is a physical lower limit of the minimum value of beam blanking, that is minimum irradiation time in the sequential beam exposure method where the exposure energy is controlled by a beam blanking time. In more detail, in the apparatus shown in FIG. 1, the moving speed of aperture 25 for beam blanking, and the acting speed of blanking control circuit and so on have limits, and thus it is impossible to unlimitedly reduce the beam blanking time. The exposure apparatus has its own minimum value for irradiation time.

The present invention sets the exposure doses used in the multiple exposure zone in a manner such that the exposure dose such as above mentioned doses $A'_{2min}$, $B'_{1min}$, and Min is set to the above minimum value of irradiation time, or a value as close to as the minimum value, with the result that the invention can achieve the best adjustment for exposure dose in the given apparatus. This improved adjustment for exposure dose may be applicable and effective to any embodiments of the invention, including those mentioned hereinafter.

FIG. 5 shows the manner in which each of striped areas is exposed in sequence from left to right. Each striped area overlaps the next striped area in the overlapping zone of 64 μm in width.

Figure 6:
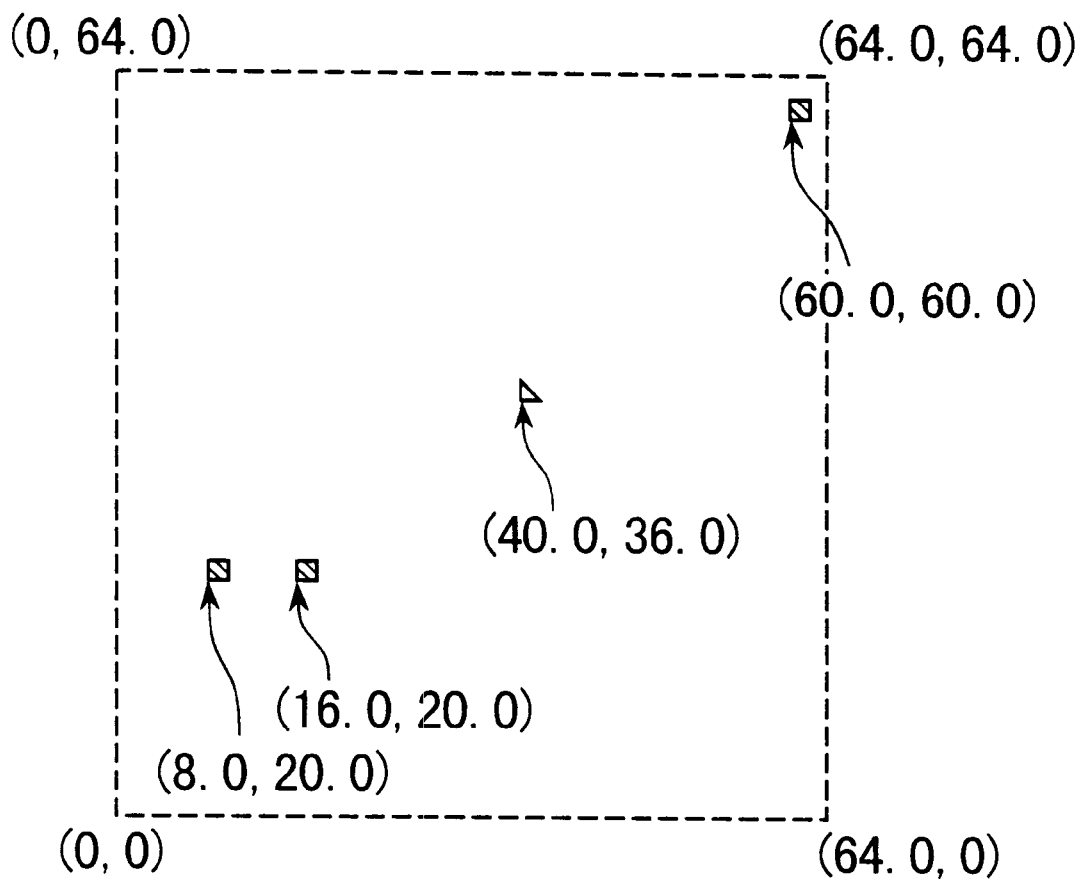
FIG. 6 is a diagram for use in explanation of exposure dosage calculation processing in the first embodiment.

Using the reference exposure dosage of 6 $\mu C/cm^2$ the exposure processing is carried out based on proximity effect correction data. In the overlapping zone, the exposure dosage for each shot is calculated using the distance from the exposure starting point of the overlapping zone. The position of each shot is defined by a vertex of a graphic form as shown in FIG. 6. In the overlapping zone, the exposure dosage for each shot is calculated using its distance from the end close to the main exposure area of the corresponding striped exposure area, i.e., according to its x-axis coordinate in the overlapping zone 64 μm in width.

Figure 7A:
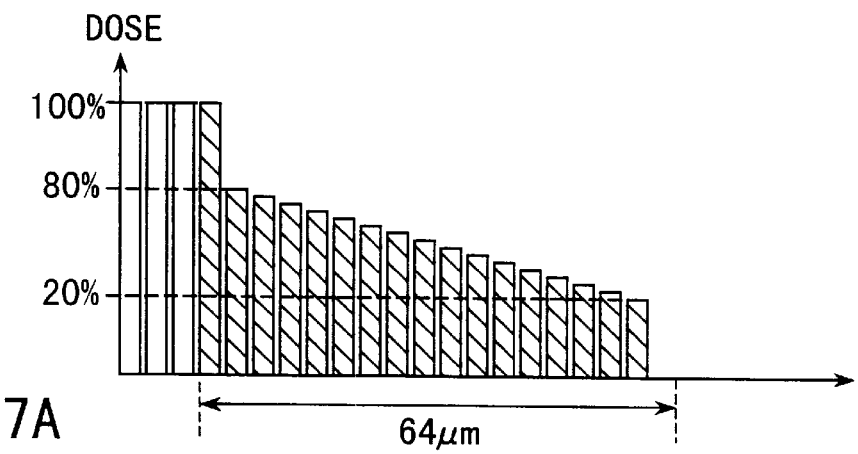
FIGS. 7A to 7C are diagrams for use in explanation of exposure processing of the first embodiment and illustrate another example of the ratio between exposure dosages in the overlapping zone of the adjacent fields, FIG. 7A showing the percentage exposure dosages in the overlapping zone in one field, FIG. 7B showing the percentage exposure dosages in the overlapping zone in the other field, and FIG. 7C showing the totalization of the percentage exposure dosages shown in FIGS. 7A and 7B.
Figure 7B:
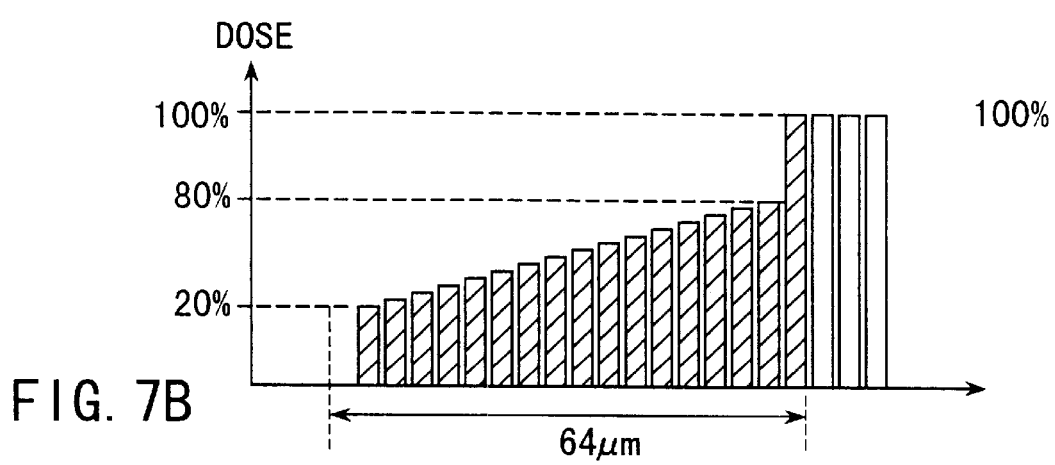
Figure 7C:
Figure 7C:
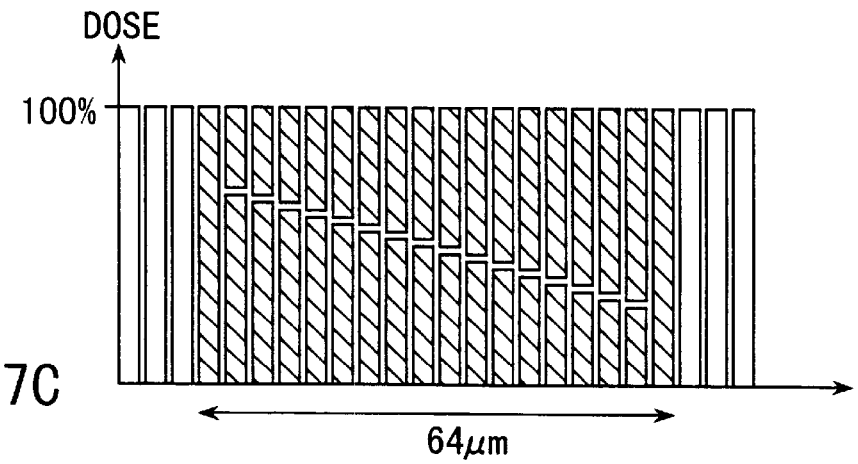

More strictly, the exposure dosage for shots in the overlapping zone is set to, as shown in FIGS. 7A to 7C, progressively decrease from 80% to 20% in the overlapping zone except 4 μm at both ends of the overlapping zone. FIG. 7A shows the exposure settings in the right end portion of the left striped exposure area of two adjacent striped exposure areas in the arrangement of striped exposure areas shown in FIG. 5. FIG. 7B shows the exposure settings in the left end portion of the right striped exposure area. FIG. 7C shows schematically the total exposure dosage for each shot in the overlapping zone.

The exposure dosage for each shot in the overlapping zone of one striped exposure area has been recorded. In exposing the next striped exposure area, the recorded dosage is subtracted from the exposure dosage that the exposure area is to receive (100% exposure dosage) and the resultant value is set as the exposure dosage for the corresponding shot in the overlapping zone of the next exposure area.

After exposure, the substrate was placed in a vacuum for 20 minutes and then left exposed to the air for 30 minutes. Next, the substrate was placed over a hot plate maintained at 90° C. with a spacer of 0.22 mm thick interposed and then baked for 15 minutes. Immediately after baking, the substrate was placed on a cooling plate maintained at 18° C. for 20 minutes. Then, the substrate was left as it was at room temperature and it was returned to room temperature.

Next, the substrate was set in spray development equipment, then sprayed with a developing solution (AD-10 manufactured by TAMA KAGAKU company) maintained at 23° C. from full cone nozzle, spun at 100 rpm for development for 75 seconds and rinsed with highly pure water. After baking for 20 minutes at 100° C., the Cr-based opaque film was etched using a mixed gas of chlorine and oxygen in a dry etching equipment. Twenty minutes was taken to etch the film of about 0.1 μm in thickness. From RF reflected wave intensity monitoring, etching of just +50% was observed.

After the removal of the resist, using a confocal microscope the dimensions of space patterns which are surrounded with the opaque film and for which design data is 0.8 μm were measured.

Measurements were made on a total of 100 patterns, 50 patterns in the overlapping portion and 50 patterns in the non-overlapping portion, with respect to the space widths in the X- and Y-axis directions. According to the measurements, the average space width in the x-axis direction was 0.856 μm in the overlapping portion and 0.642 μm in the non-overlapping portion, and the average space width in the y direction was 0.846 µm in the overlapping portion and 0.852 µm in the non-overlapping portion. The space width in the x direction had a variation of 13 nm (3σ) in the over-lapping portion and 14 nm (3σ) in the non-overlapping portion. The space width in the y direction had a variation of 17 nm (3σ) in the overlapping portion and 15 nm (3σ) in the nonoverlapping portion. These results show that there is no significance difference in dimensional accuracy between the overlapping and nonoverlapping portions.

Pattern position measurements shows that the accuracy in the overlapping portion is about 13% lower than in the nonoverlapping portion.

In each striped exposure area of 1024 µm in width, no changes of the exposure dosage are applied to the connecting portion between an overlapped area of 64 µm in width and areas adjacent thereto of 64 µm width. Also, the side end portion of each striped exposure area of 1024 µm and the side end portion of areas of 64 µm width are adjusted in position, not to locate at the same position.

As described above, the present embodiment, in exposing each of striped exposure areas of 1024 µm in width in sequence, makes each striped exposure area overlap the adjacent striped exposure area by 64 µm, subjects the overlapping zone to multiple exposure and sets the total exposure dosage in the overlapping zone equal to the exposure dosage used when single exposure process is applied. Further, by changing the exposure dosage in the multiple-exposure zone (overlapping zone) of each striped exposure area in steps from 20% to 80%, an electron beam-based step and repeat exposure system can be implemented which allows pattern dimensions and positions to be prevented from changing in steps in the overlapping zone. Thus, adjacent striped exposure areas can be joined with high accuracy and pattern accuracy can be improved.

Furthermore, by setting up the multiple exposure zone in subfield units for multiple exposure processing, conventional data processing techniques can be used as they are. For this reason, there is no need to introduce intricate exposure data management for improving pattern accuracy.

In this embodiment, the lower limit of the percentage of exposure dose is set to 20%. The lower limit of the percentage may be determined in a manner such that the minimum exposure dose calculated by the proximity effect correction is not less than the least exposure dose available in the exposure apparatus.

Second Embodiment

The present invention is also applicable to a multiple exposure method. Hereinafter, the fabrication of a reticle using the multiple exposure method of the present invention will be described.

As with the aforementioned first embodiment, the exposure system of FIG. 1 is used. A substrate to be exposed is one made by coating a standard size quartz glass plate, 6025 by HOYA company, with a Cr film, applying an electron beam resist to the Cr film at a thickness of 0.5 µm and subjecting the resulting structure to baking. The resist is ZEP 7000 manufactured by NIPPON ZEON company.

The substrate is loaded into the sample chamber 10 of the exposure system and then placed on the stage 12. The exposure processing was performed at a reference exposure dosage of 13 µC/cm$^2$.

Figure 8A:
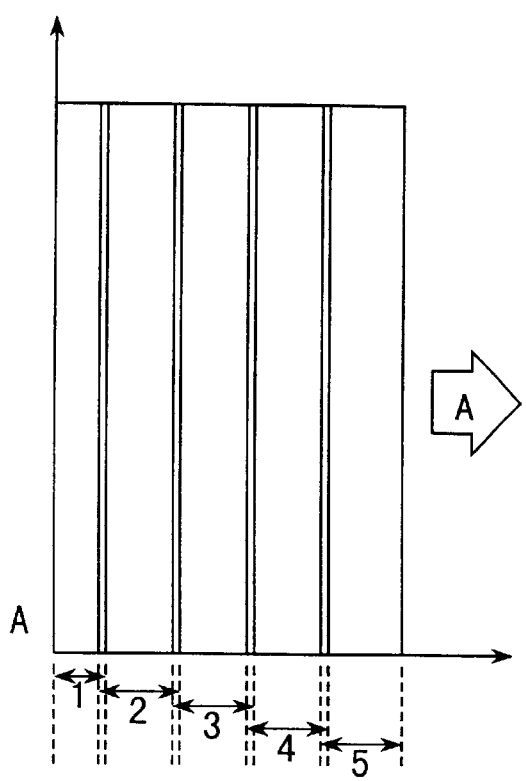
FIGS. 8A to 8C are diagrams for use in explanation of exposure processing according to a second embodiment of the present invention.
Figure 8B:
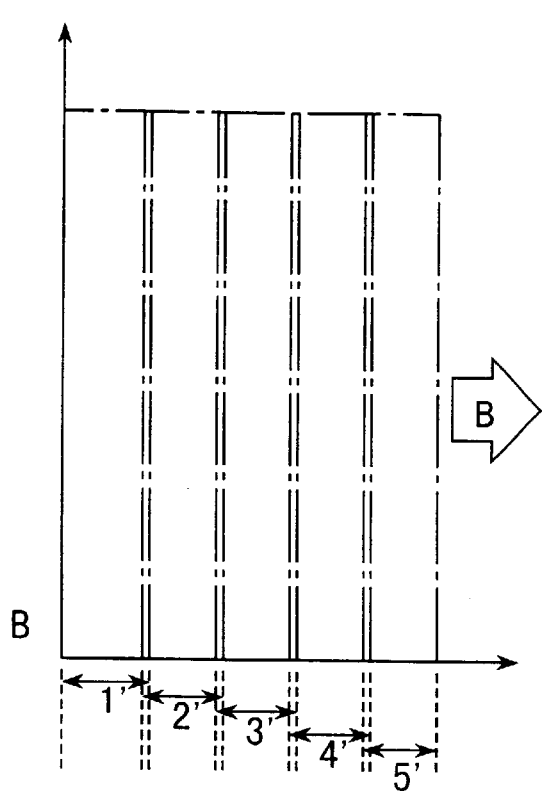
Figure 8C:
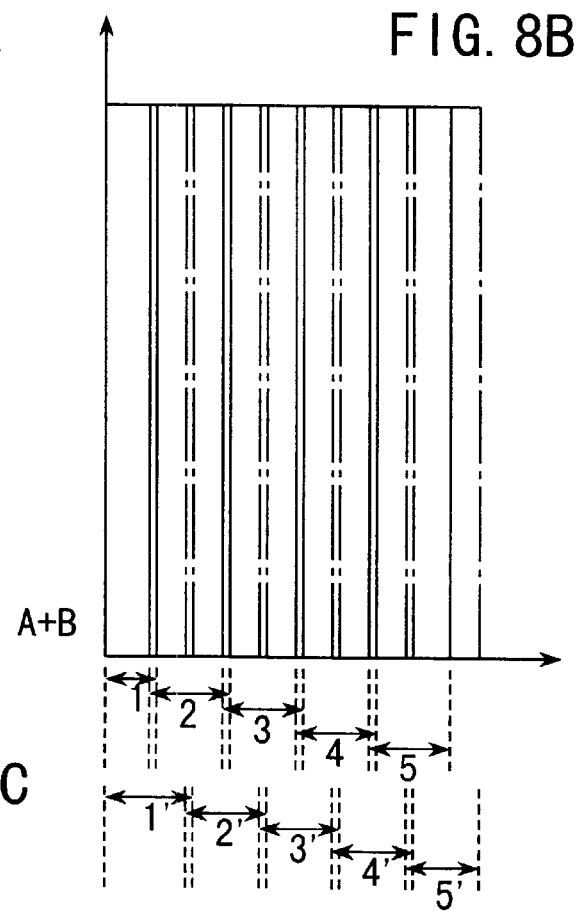

First, in FIG. 8A, at the first exposure, the left-end striped area is exposed in 512 µm width and each of the remaining striped exposure areas are exposed in 1024 µm width at the reference exposure dosage 13 µC/cm$^2$ using proximity effect corrected data. In FIG. 8B, the second exposure is made at the reference exposure dosage 13 µC/cm$^2$ in any of striped exposure areas FIG. 8C shows how the striped exposure areas provided by the first and the striped exposure areas provided by second exposure are allocated. That is, the main exposure areas are exposed double at the total exposure dosage of 26 µC/cm$^2$. The double exposure is adopted to avoid the generation of heat due to incidence of electron beams and average variations in exposure dosage and positioning.

The areas which are exposed double (located at opposite sides of each striped exposure area) are allocated at different positions in the first exposure and the second exposure. In the main area, the ratio between the first and the second exposure dosage was set at one to one.

Because a situation inevitably occurs in which exposure dosage takes a non-processable value, say, ½ of the minimum unit of exposure dosage, exposure data were created so that the sum of the dosage in the first exposure and the dosage in the second exposure becomes a predetermined value.

The processing for exposure dosage fractions was also performed for the overlapping zones. More specifically, a value of a total amount of exposure dosage is firstly computed per exposure unit on the basis of proximity effect correction processing, then the value is divided into plural exposure dosages for plural exposure treatment. Each of exposure dosage given by the division of the value is set by firstly determining the exposure dosage for the first exposure treatment, and then determining the exposure dosages for the subsequent exposure treatment on the basis of the exposure dosage for the first exposure treatment.

The above mentioned process for determining the exposure dosages will be described in more detail.

Generally, in a step and repeat process system, an exposure dosage is processed in the form of digital date, not analog data. For instance, an exposure dosage may be determined by the equation:

Exposure dosage=(the least exposure dose available in an apparatus)+(a step dose)×(binary data). Since the exposure dosage is determined by using binary data, an digitized error is caused. The amount of each digitized error is less than ½ of the step dose. However, when such digitized errors are accumulated, it may significantly affect on the accuracy of the dimension of a transferred pattern. Specifically, in an exposure method like this embodiment where a transfer of pattern is conducted by plural exposure treatments, accumulated digitized errors are more likely to cause a serious error regarding the dimension of a transferred pattern.

Figure 9A:
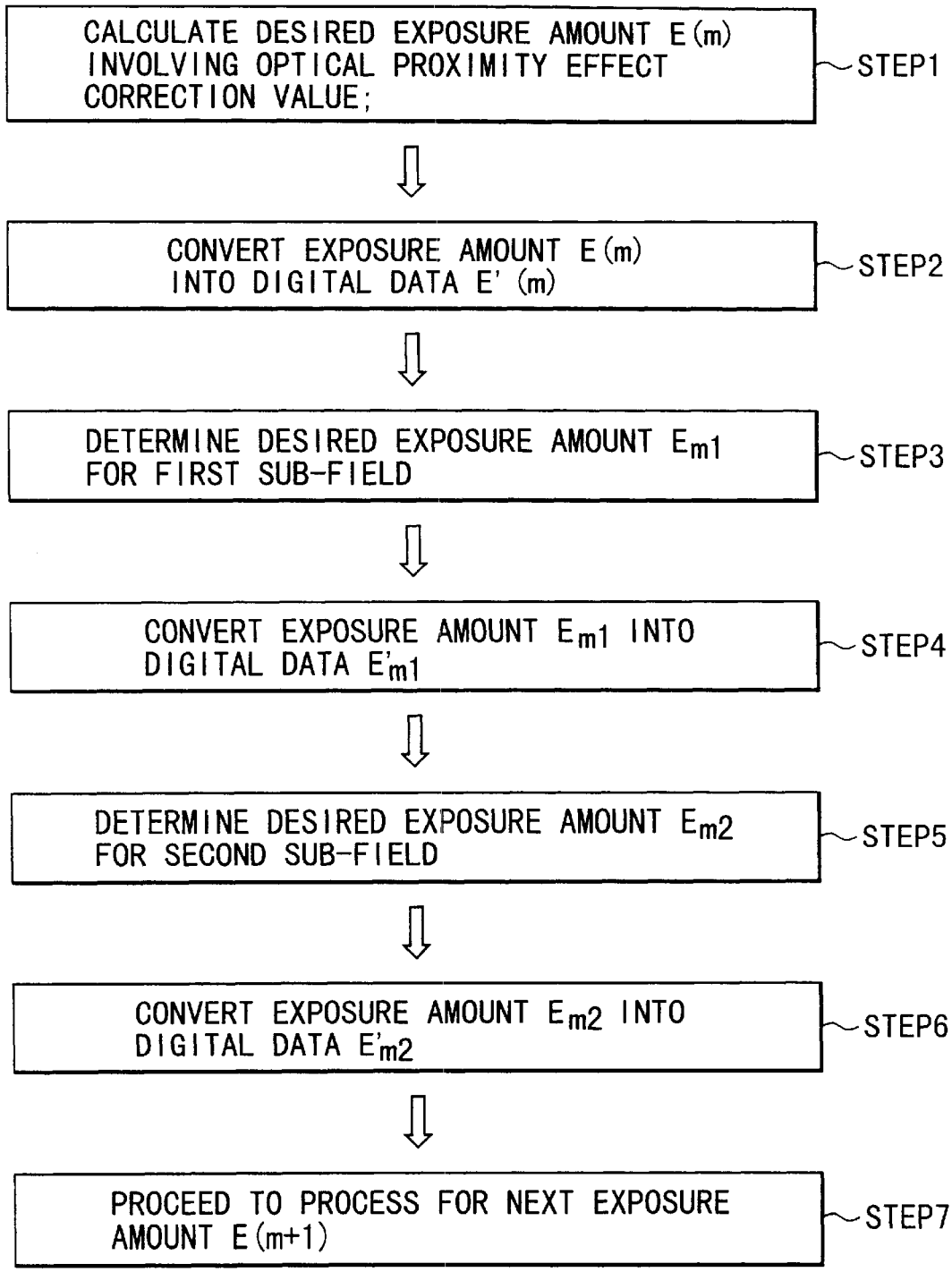
FIG. 9A is a schematic flowchart for an example of a conventional method of determining an exposure dose.

FIG. 9A shows an example of a conventional method for determining exposure dosage. In this example, a part of pattern is transferred by multiple exposure treatment consisting of an exposure for a first subfield and an exposure for a second subfield which is conducted to overlap the first subfield. As seen from FIG. 9A, since the data E(m), Em1 and Em2 are converted into digital data (Steps, 2, 4, and 6) in this method, digitized error is caused three times and the digitized errors are accumulated.

In contrast to the above conventional method, a method proposed herein can reduce the time of occurrence of digitized error to one by computing exposure dosages in a manner such that the sum of the exposure dose given by the first exposure treatment and the exposure doses given by subsequent exposure treatment equal to a predetermined value.

Figure 9B:
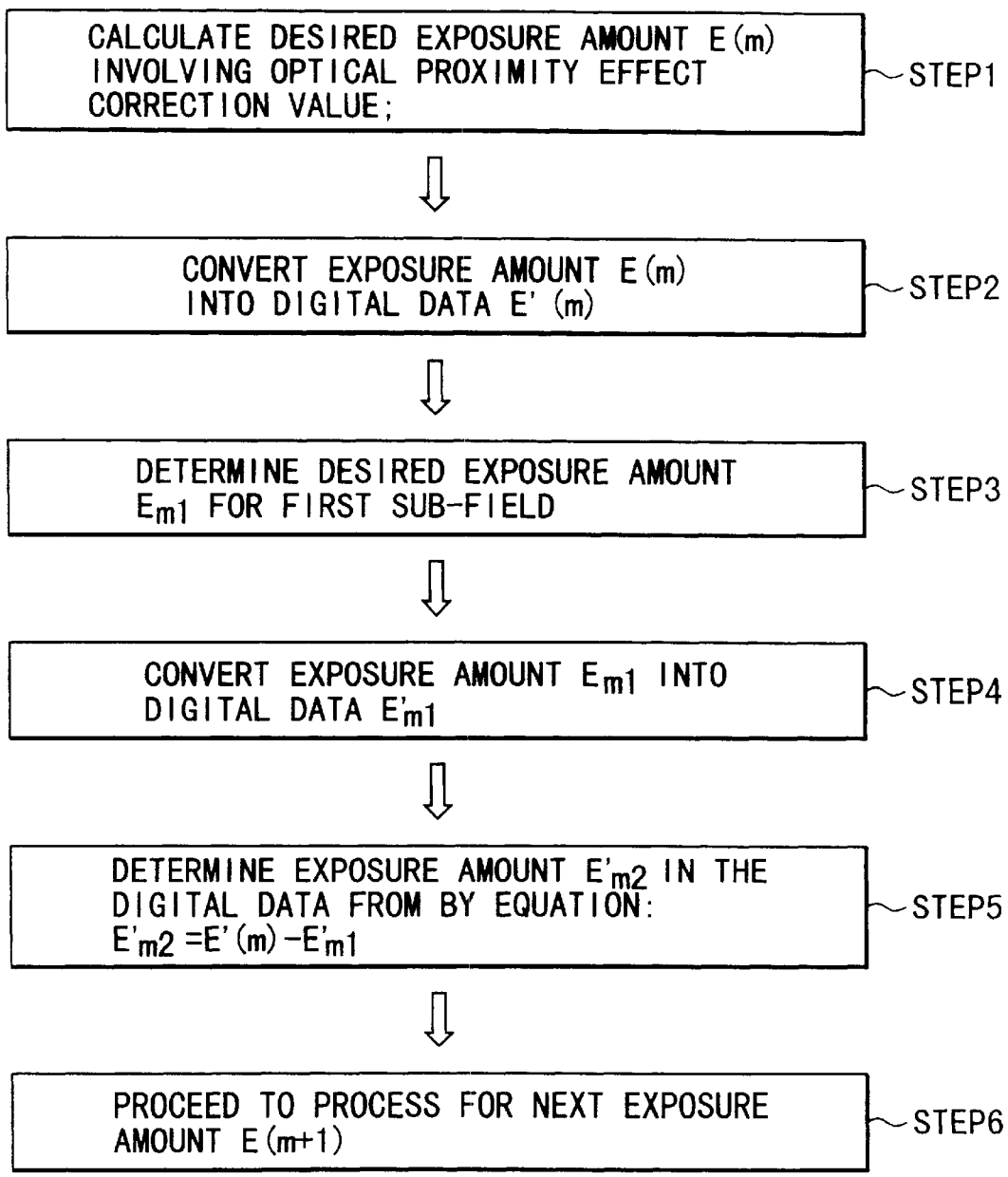
FIG. 9B is a schematic flowchart an example of an exemplary method of determining an exposure dose according to the invention.

FIG. 9B shows an example of method for determining exposure dose according to this embodiment. The method according to the embodiment is the same as the conventional one with respect to Steps 1 to 4. In the processes from Steps 1 to 4, a digitized error may be slipped into E'(m) and E'm1. In Step 5, E'm2 is determined in accordance with the relation "E'm=E'm1+E'm2". A digitized error included in E'm1 and that in E'm2 cancel each other, and thus a digitized error in E'(m) is the only digitized error caused in this improved method. According to this improved method, it is possible to reduce the number of times regarding occurrence of digitized error to one, regardless of the number of times of exposure treatments applied to the overlapping area or the like. Thus, the method for determining exposure dose according to the invention is applicable and effective to not only double exposure treatment but also triple exposure treatment and further multiple exposure treatment.

In the present embodiment, the width of the area subjected to double exposure was set to 128 μm. The exposure dosage for each shot was calculated based on its distance from the exposure starting point in the area of 128 μm wide. In the present embodiment as well, as shown in FIG. 6, the position (X and Y coordinates) of each pattern is defined in terms of its vertex. For each 128-μm wide overlapping zone, exposure dosages were calculated according to X-coordinate values from the end of the zone.

Figure 10A:
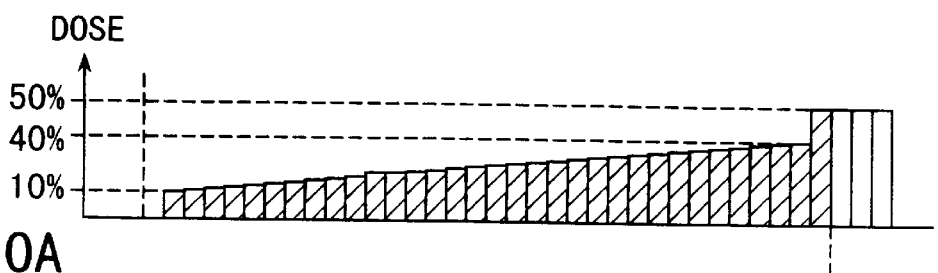
FIGS. 10A to 10D are diagrams for use in explanation of exposure processing of the second embodiment and illustrate the ratio between exposure dosages in the overlapping zone of the adjacent fields, FIG. 10A showing the percentage exposure dosages in the overlapping zone in one field, FIG. 10B showing the percentage exposure dosages in the overlapping zone I the other field, FIG. 10C showing the percentage exposure dosages in the overlapping zone in the second exposure processing, and FIG. 10D showing the totalization of the percentage exposure dosages in the overlapping zone shown in FIGS. 10A to 10C.
Figure 10B:
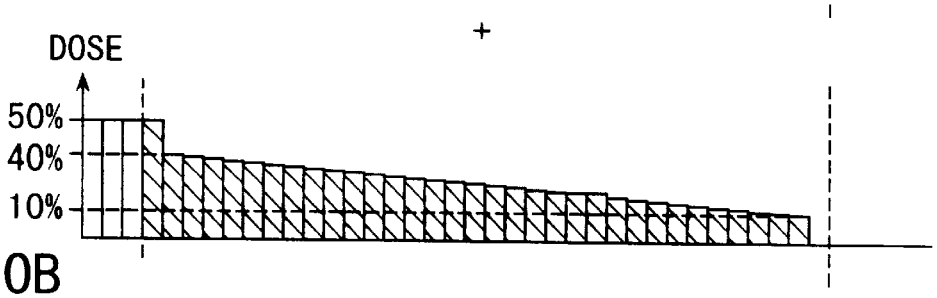
Figure 10C:
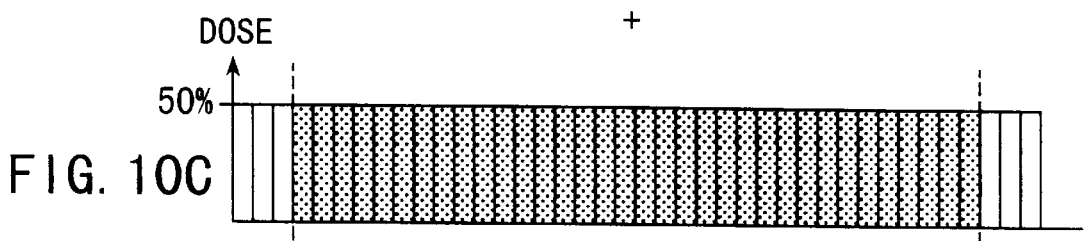
Figure 10D:
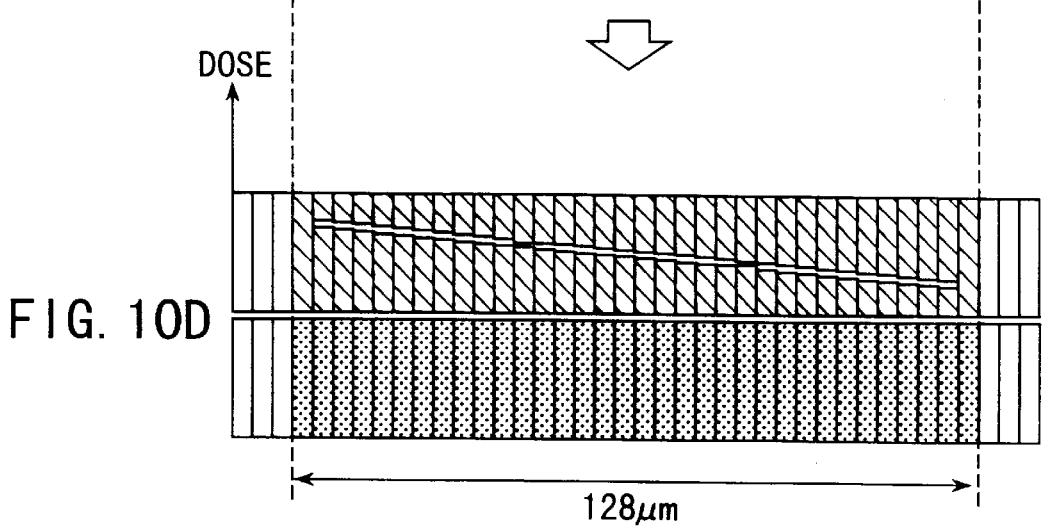

The exposure dosages for shots in the overlapping zone are set to, as shown in FIGS. 10A and 10B, progressively decrease from 40% to 10% in the overlapping zone except 4 μm at both ends. The exposure dosage for each shot in the overlapping zone of one striped exposure area has been recorded. In exposing the next striped exposure area, the recorded dosage is subtracted from the exposure dosage that the exposure area is to receive (50% exposure dosage) and the resultant value is set as the exposure dosage for the corresponding shot in the overlapping zone of the next exposure area. In the second exposure step (B), the exposure dosage for that overlapping zone is set to 50% of the reference exposure dosage (FIG. 10C). In the end, three exposure dosages are totalized in each overlapping zone as schematically shown in FIG. 10D.

After exposure, the reticle is taken out of the sample chamber 10. Next, the reticle was set in spray development equipment, then sprayed with a dedicated developing solution maintained at 23° C. from full cone nozzle, spun at 100 rpm for development for 75 seconds and rinsed with a dedicated rinse solution. Next, the resist was subjected in a dry etching equipment to plasma descum etching using wet air gas for 90 seconds at 75W. By this etching process, the thickness of the resist was reduced by about 0.05 μm.

Next, as in the first embodiment, the Cr-based opaque film was etched using a mixed gas of chlorine and oxygen. Twenty minutes was taken to etch the film of about 0.1 μm in thickness. From RF reflected wave intensity monitoring, Just +50% of etching was observed.

After the removal of the resist, the exposed space patterns which are surrounded with the opaque film and for which design data is 0.8 μm and the line patterns formed of the opaque film were measured using a confocal microscope. The measurements were made on the center and the upper right and upper left corners of an area about 25 μm on a side including the area 128 μm wide subjected to double exposure. No abnormal line width resulting from double exposure was noticed. The line patterns had a variation of 18.1 nm (3σ) and the space patterns had a variation of 14.6 nm (3σ). No noticeable difference was found with respect to the x direction and the y direction.

In the multiple exposure of the present embodiment, the striped areas shown in FIG. 8C may be exposed in the order of 1, 1', 2, 2', 3, 3', 4, 4', and 5, and so on. It is also possible to increase the number of exposures in multiple-exposure processing.

It is desirable to set exposure dosages in the overlapping zone in fine steps. To decrease the complexity of data processing, it is also possible to divide a small area, for example, 64 μm on a side, into non-multiple exposure parts and multiple exposure parts and determine an exposure dosage for each part by one criterion, which realizes part of advantages of the present invention. That is, a method to select exposure dosages for shots by the same criterion is also an aspect of the present invention.

Forming an overlapping zone from a number of small areas 64 μm on a side and determining an exposure dosage for each small area according to one criterion are encompassed within the scope of the present invention. If the effect of the addition of exposure dosages cannot be achieved uniformly owing to the characteristics of the resist, then it will be required to correct the exposure dosages. Depending on the number of exposures, resist-dependent differences may arise in pattern dimensions. It is fully expected that the differences can be eliminated by making corrections to exposure dosages. In implementing the present invention, therefore, corrections may be made in such a way as to add exposure correction values provided for the resist characteristics.

Figure 11:
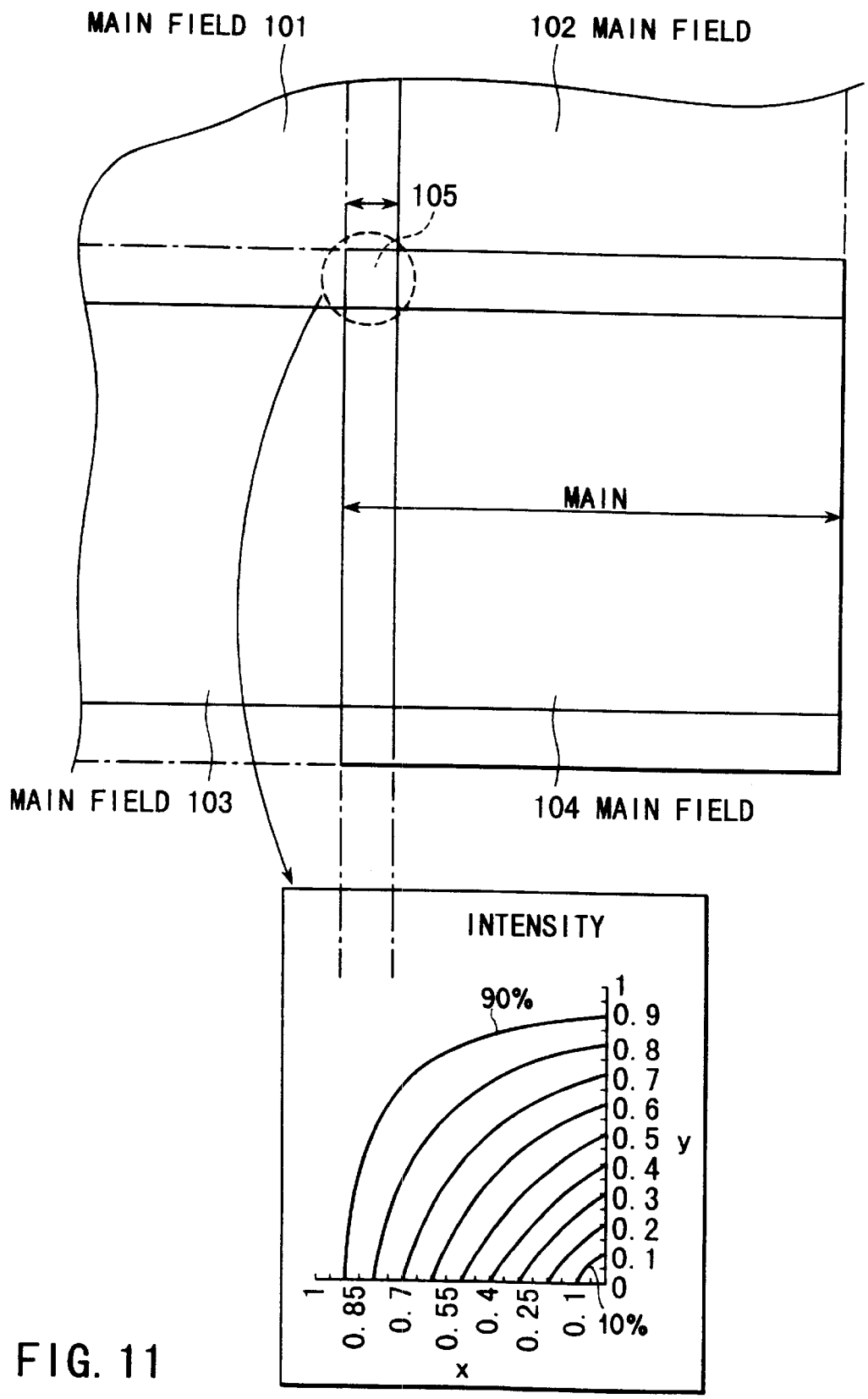
FIG. 11 is a diagram for use in explanation of exposure processing of the second embodiment when four fields overlap one another at their corner and illustrates the manner in which percentage exposure dosages in the overlapping zone are determined.

The present invention has been described as exposing adjacent striped exposure areas, which overlap each other at their sides, in a step and scan fashion. This is not restrictive. The present invention can be applied to step and repeat exposure for two or more connected areas. For example, as shown in FIG. 11, when four square exposure areas overlap one another on a substrate, exposure in the overlapping zone is simply made in four step and repeat exposures. When four main fields 101, 102, 103 and 104 overlap one another in an area 105, exposure dosages for individual exposure units in that overlapping area may be decreased in accordance with distances of the exposure units in the x and y directions.

Although the present invention has been described in terms of pattern formation, this is not restrictive. The principles of the present invention may be applied to display devices for display with improved connection accuracy. The present invention can be applied not only to the formation of two-dimensional patterns on a substrate but also to the formation three-dimensional patterns. In step and repeat lithography, the use of the inventive multiple exposure at ends of exposure areas allows the formation of patterns with improved accuracy in connection.

In the present invention, the overlapping zone is not restricted to an area 64 μm on a side. The area may be further divided, depending on the exposure method or equipment configuration. In other words, the invention is applicable to the case that a region exposed non-sequentially provides a second region exposed non-sequentially, and the second region exposed non-sequentially then provides a third region exposed non-sequentially. A fourth or subsequent regions may be further provided in the case. The method according to the invention can be performed at least one time for each layer.

Figure 12:
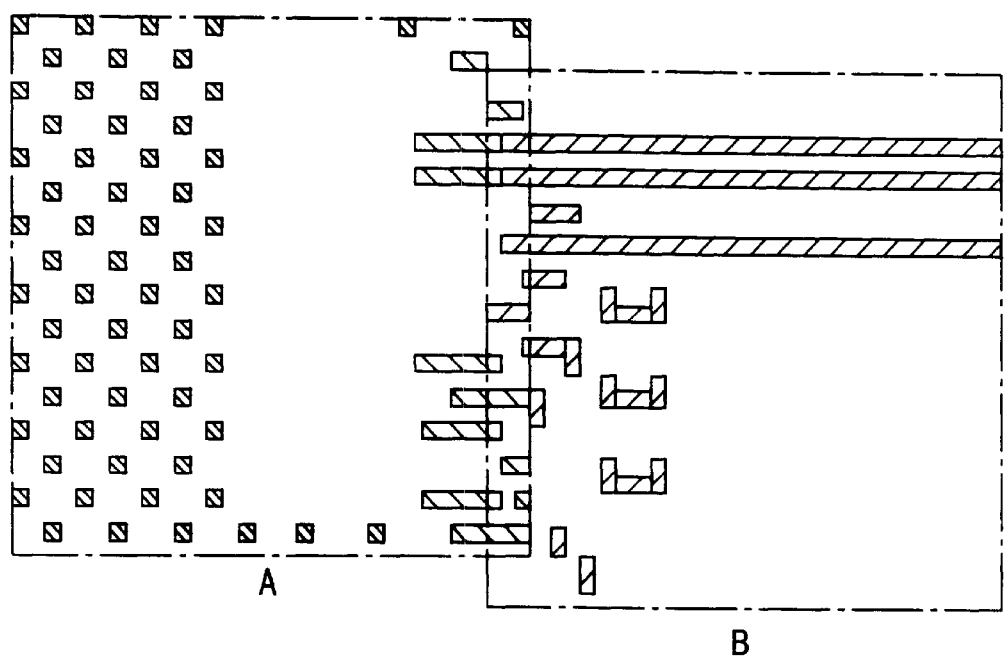
FIG. 12 is a diagram for use in explanation of the second embodiment and illustrates pattern arrangements in the overlapping zone.

In the exposure method described so far, a fixed exposure unit is used. That is, to form a striped exposure area, subareas, each 64 μm on a side, are arranged regularly, i.e., in a grid form. However, the present invention does not depend on the regular arrangement. The subareas are not limited to square shape. Further, as shown in FIG. 12, exposure subareas, say, 64 µm on a side, may be arranged in an overlapping manner and shots present in the overlapping zone may be defined in either of the subareas. Subareas of different size may be arranged to overlap each other in at least a portion thereof.

Third Embodiment

Figure 13A:
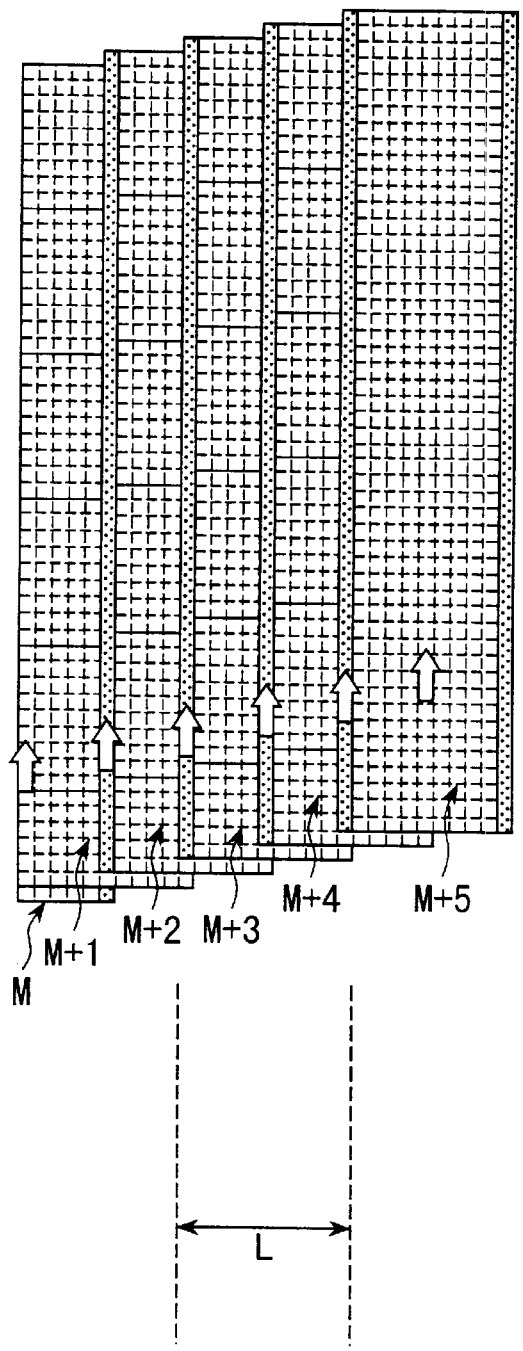
FIGS. 13A and 13B are conceptual diagrams of a third embodiment of the present invention, FIG. 13A showing a positional relationship among fields and FIG. 13B showing a relationship between field data stored on a disk and field data rearranged in a buffer memory.
Figure 13B:
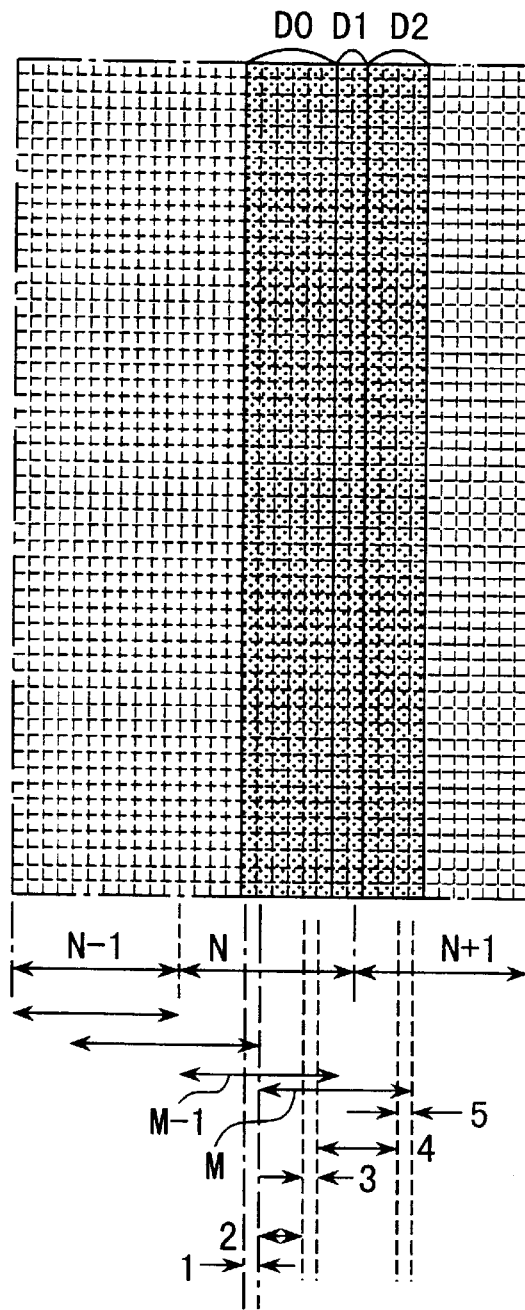

Reference is made to FIGS. 13A and 13B to describe the data processing method more specifically.

In this embodiment, striped exposure areas M to M+5 (hereinafter referred to simply as stripes) and subfields which are each one unit area for step and repeat exposure and comprise a stripe are used for data management and exposure processing. The overlapping zone of stripes is formed in subfield units.

In the exposure processing of the present embodiment, as shown in FIG. 13A, multiple exposure is made so that the width of the overlapping zone of adjacent stripes becomes about ½ of the stripe width L. The entire surface is exposed double under the condition that each stripe is offset from the next stripe by about ½ of the stripe width. In this case, each of the stripes is exposed by the procedure of exposing each of M, M+1, . . . , M+5 in sequence as shown in FIG. 13A as opposed to exposing the entire surface twice. In FIG. 13A, each of stripes is shown offset from the next stripe in the vertical direction, which is merely intended to illustrate the overlapping of stripes. The reference irradiation dose is set to 20 $\mu C/cm^2$.

Irradiation dosage data for proximity effect correction are set for each sub-area of the order of 1 to 2 µm in width. The data has 256 gradations from 0 to 255. 0 corresponds to the minimum irradiation dosage and 256 to the maximum irradiation dosage. A table is set up in which 256 gradations are mapped into actual irradiation dosages. The table data have been stored in advance on a disk for each stripe.

Control software associated with the exposure system makes access to pattern data of each stripe on the disk and then delivers stripe pattern data to be drawn to a buffer memory. At this point, the control software specifies data to be sent in response to selection of a stripe width. Data to be sent to the buffer memory include data selected from data managed in a single stripe and data in which subfields are rearranged and sequenced into a new stripe from data managed in two adjacent stripes. Control data for arrangement information are preserved in all the data of subfields to be sent. The buffer memory, as instructed by the control software, discards part of preserved data and rearranges the remaining data and the data sent from the disk to prepare exposure stripe data.

FIG. 13B shows a relationship between on-disk data and on-buffer memory data. The M-th exposure stripe data is rearranged by transferring parts D1 and D2 of the N-th and (N+1)st stripe data on the disk to a part D0 of the (M−1)st exposure stripe data. In the boundary between stripes, an overlapping area in subfield units is set up. In the subfields of the (M−1)st exposure stripe data which had already been subjected to exposure processing, the results of exposure have already been preserved.

In actual pattern drawing, the system performs processing on a subfield-by-subfield basis. In an area excluding the exposure starting stripe or the ending stripe of a sequence of stripes, subfields in one exposure stripe are divided in the direction of the stripe width into the following five types:

(1) Subfields which form an overlapping zone at an end of the stripe width and are subjected to the first exposure for multiple exposure in subfield units in the (N−2)nd exposure and, in the (N−1)th exposure, to the second exposure with an exposure dosage which is about half of one calculated using proximity effect corrected data.

(2) Subfields, excluding the (1) subfields, which, in the (N−1)st exposure, have already been subjected to exposure with an exposure dosage which is about half of one calculated using proximity effect corrected data.

(3) Subfields which, in the (N−1)st exposure, have been subjected to multiple exposure at an end of the stripe.

(4) Subfields which are unexposed ones in other portions than the end of the stripe.

(5) Subfields which are unexposed ones at the other end of the stripe width.

For the (1) subfields, the remaining exposure dosage is set for each shot. For the (2) subfields as well, the remaining exposure dosage is set. For the (3) and (4) subfields, an exposure dosage of approximately 50% is set. This approximate setting is performed because a situation may arises in which a value that exactly equals 50% of an exposure dosage calculated for each shot using proximity effect corrected data is an uncontrollable one. For the (5) subfields, an exposure dosage for multiple exposure is set. For multiple exposure, exposure dosages for shots in the subfield are calculated to progressively decrease from 37% to 13% in the direction from the inside to the outside of the stripe according to their distance and then the resultant data are recorded. The actual exposure data for shots have been subjected to proximity effect corrections and therefore have not necessarily the same value even if they are located in the same position in different subfields. Subfield-by-subfield exposure is repeated in the direction of the width and exposure in the direction of the stripe length is performed by the scan operation of the stage. This operation is repeated. In this manner, double exposure is performed with overlapping in subfield units.

Data for each shot may be recorded as it was calculated or calculated at the time of exposure. Corrections on variations in resist characteristics and exposure control attendant multiple exposure are included within the scope of the present invention.

The present invention may be practiced or embodied in still other ways without departing from the scope and spirit thereof. Although the present invention has been described in terms of electron beam lithography, the principles of the invention are applicable to ion beam, ultraviolet radiation, X-ray, or laser lithography.

As described above, according to the present invention, in making multiple exposure in the boundary portion between adjacent exposure areas, the occurrence of stairlike changes in pattern dimensions and positions in the boundary portion can be avoided even in step and repeat lithography by setting the ratio of exposure dosage in one area to that in the other area so that the multiple exposure area and the nonmultiple exposure area are subjected to an equal amount of exposure and changing the exposure dosages in the boundary portion in steps within a range excluding 0% and 100% in the direction perpendicular to the direction of length of the boundary portion. This leads to an improvement in the accuracy of connection of the exposure areas and consequently in the pattern accuracy. Further, by decreasing the exposure dosage for each exposure area from the inside to the outside of the boundary portion, steplike variations are reduced in comparison with the case where the exposure areas are connected with no overlapping zone for multiple exposure. That is, the accuracy of connection between exposure areas can be improved and the pattern accuracy can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method for forming a desired pattern on the surface of an object by exposing the surface with an exposure apparatus, comprising the steps of:
   dividing an area to be exposed into a plurality of fields;
   applying a sequential exposure process to each of said plurality of fields by using a shaped beam, wherein:
      an area where adjacent fields overlap each other is subject to multiple exposure process,
      the exposure dosage given by the shaped beam is controlled in a manner such that the total exposure dosage at any exposure unit in the boundary portion for multiple exposure is set equal to an exposure dosage for single exposure at each of exposure units, and the exposure dosage in said boundary portion of each of the adjacent fields is increased in steps, within the range between a least exposure dose and an exposure dose less than a predetermined exposure dose subtracted by the least exposure dose, in the direction perpendicular to the longitudinal direction of the boundary portion from the outer edge of the field towards the inside of the field,
      exposure dosage in the area subject to multiple exposure process is determined on the basis of a minimum exposure dose available in the exposure apparatus.

2. The method according to claim 1, wherein:
   the least exposure dose in the area subject to the multiple exposure process is substantially equal to the minimum exposure dose available in the exposure apparatus.

3. The method according to claim 2, wherein:
   said area subject to the multiple exposure process is processed by at least a first exposure and a second exposure, and
   the exposure dose of said second exposure is determined by subtracting the exposure dose of said first exposure from a desired exposure dose.

4. The method according to claim 1, wherein:
   at least one of a variable shaped beam and a non-variable shaped beam is generated on the basis of exposure data,
   a beam shot as a unit is provided by projecting the shaped beam at a desired position during a time period corresponding to a desired exposure dose, on the basis of said exposure data, and
   said beam shot is repeated sequentially to write a desired pattern.

5. The method according to claim 1, wherein:
   said exposure apparatus comprises a main deflector and at least one-stage sub-deflector,
   a main deflection area covered by the main deflector comprises plural sub-deflection areas each covered by said at least one-stage sub-deflector,
   said plural sub-deflection areas are positioned by said main deflector, and said shaped beam is oriented to project on the surface of the object at a desired position in one of said plural sub-deflection areas,
   said area subject to multiple exposure process is determined in units of said sub-deflection area.

6. A method for forming a desired pattern on the surface of an object by exposing the surface of the object with an exposure apparatus having a main deflector and at least one-stage sub-deflector, comprising the steps of:
   dividing an area to be exposed into a plurality of fields each being determined by the deflection width of the main deflector;
   dividing each field into a plurality of sub-fields each being determined by the deflection width of the sub-deflector;
   applying a sequential exposure process to each field by using a variable shaped electron beam, and applying a multiple exposure process to an area where adjacent fields overlap each other,
   wherein:
      said multiple exposure process is conducted in the area in units of sub-field,
      the exposure dose at each of exposure unit is determined such that the total exposure dosage in the area subject to the multiple exposure process is set equal to an exposure dosage for single exposure at each of exposure units, the exposure dosage in said area subject to multiple exposure process is increased in steps, within the range between a least exposure dose and an exposure dose less than a predetermined exposure dose by the least exposure dose, in the direction perpendicular to the longitudinal direction of the boundary portion from the outer edge of the field towards the inside of the field,
      an exposure dosage in the area subject to the multiple exposure process is determined on the basis of the minimum exposure dosage available in the exposure apparatus.

7. The method according to claim 6, wherein:
   the least exposure dosage in the area subject to the multiple exposure process is substantially equal to the minimum exposure dosage available in the exposure apparatus.

8. The method according to claim 7, wherein:
   said area subject to the multiple exposure process is exposed by at least two times exposures,
   the exposure dose of a selected one of said at least two times exposures is determined by subtracting the sum of the exposure doses of said at least two times exposures excluding said selected one from a desired total exposure dose.

* * * * *